United States Patent [19]

Sanjurjo

[11] Patent Number: 4,590,043
[45] Date of Patent: May 20, 1986

[54] APPARATUS FOR OBTAINING SILICON FROM FLUOSILICIC ACID

[75] Inventor: Angel Sanjurjo, San Jose, Calif.
[73] Assignee: SRI International, Menlo Park, Calif.
[21] Appl. No.: 453,734
[22] Filed: Dec. 27, 1982
[51] Int. Cl.[4] .................................... C30B 15/10
[52] U.S. Cl. .................................... 422/189; 422/232; 422/248; 156/DIG. 64
[58] Field of Search .............. 422/232, 203, 199, 189, 422/240, 248, 241; 156/DIG. 64

[56] References Cited

U.S. PATENT DOCUMENTS

| | | | |
|---|---|---|---|
| 2,061,728 | 11/1936 | Crawford et al. | 422/189 |
| 2,708,156 | 5/1955 | Paoloni | 422/232 |
| 2,890,936 | 6/1959 | Benefield | 422/189 |
| 2,941,867 | 6/1960 | Maurer . | |
| 3,012,865 | 12/1961 | Pellin . | |
| 3,041,145 | 6/1962 | Aries . | |
| 3,101,257 | 8/1963 | Hagen et al. . | |
| 3,442,622 | 5/1969 | Monnier et al. . | |
| 3,551,098 | 12/1970 | Flemmert | 422/189 |
| 3,798,140 | 3/1974 | Sullivan et al. | 204/67 |
| 3,887,359 | 6/1975 | Enger et al. | 75/11 |
| 4,055,391 | 10/1977 | Schmidt et al. | 432/264 |
| 4,102,765 | 7/1978 | Fey et al. | 204/164 |
| 4,102,766 | 7/1978 | Fey | 204/164 |
| 4,102,767 | 7/1978 | Mazelsky et al. | 204/164 |
| 4,132,763 | 1/1979 | Schmidt et al. | 423/350 |
| 4,162,291 | 7/1979 | Arcella et al. | 422/198 |
| 4,169,129 | 9/1979 | Frosch | 423/350 |
| 4,188,368 | 2/1980 | Frosch | 423/350 |
| 4,207,360 | 6/1980 | Padovani | 427/213 |
| 4,239,740 | 12/1980 | Harvey et al. | 423/350 |
| 4,265,859 | 5/1981 | Jewett | 422/199 |
| 4,312,850 | 1/1982 | Dietl et al. | 423/350 |
| 4,442,082 | 4/1984 | Sanjurjo | 422/199 |

OTHER PUBLICATIONS

Quarterly Progess, Reports Nos. 1–15, Novel Duplex Vapor–Electrochemical Method for Solar Cell, Kapur 8/76–11/79.
Final Report, Novel Duplex Vapor–Electrochemical Method for Silicon Solar Cell, Nanis et al, 3/80.
Leading Edge, A Solar Silicon Soution?, SRI International, Summer '79.
Final Report, Heat Exchange Method–Ingot Lasting Fixed Abrasive Method–Multi Wire Slicing Phase D, Schmid et al, 6/79.
Product Specifications Sheet, Solar Silicon–A New Product for a New Age, Crystal Systems.
Quarterly Progress, Report No. 3, Silicon Ingot lasting–Heat Exchange Method, Schmid et al, 10/80.
NASA Tech Brefs, Temperature Controlled Support for a Seed Crystal, Spring '81.

Primary Examiner—Hiram H. Bernstein

[57] ABSTRACT

Apparatus for producing low cost, high purity solar grade silicon ingots in single crystal or quasi single crystal ingot form in a substantially continuous operation in a two stage reactor starting with sodium fluosilicate and a metal more electropositive than silicon (preferably sodium) in separate compartments having easy vapor transport therebetween and thermally decomposing the sodium fluosilicate to cause formation of substantially pure silicon and a metal fluoride which may be continuously separated in the melt and silicon may be directly and continuously cast from the melt.

13 Claims, 9 Drawing Figures

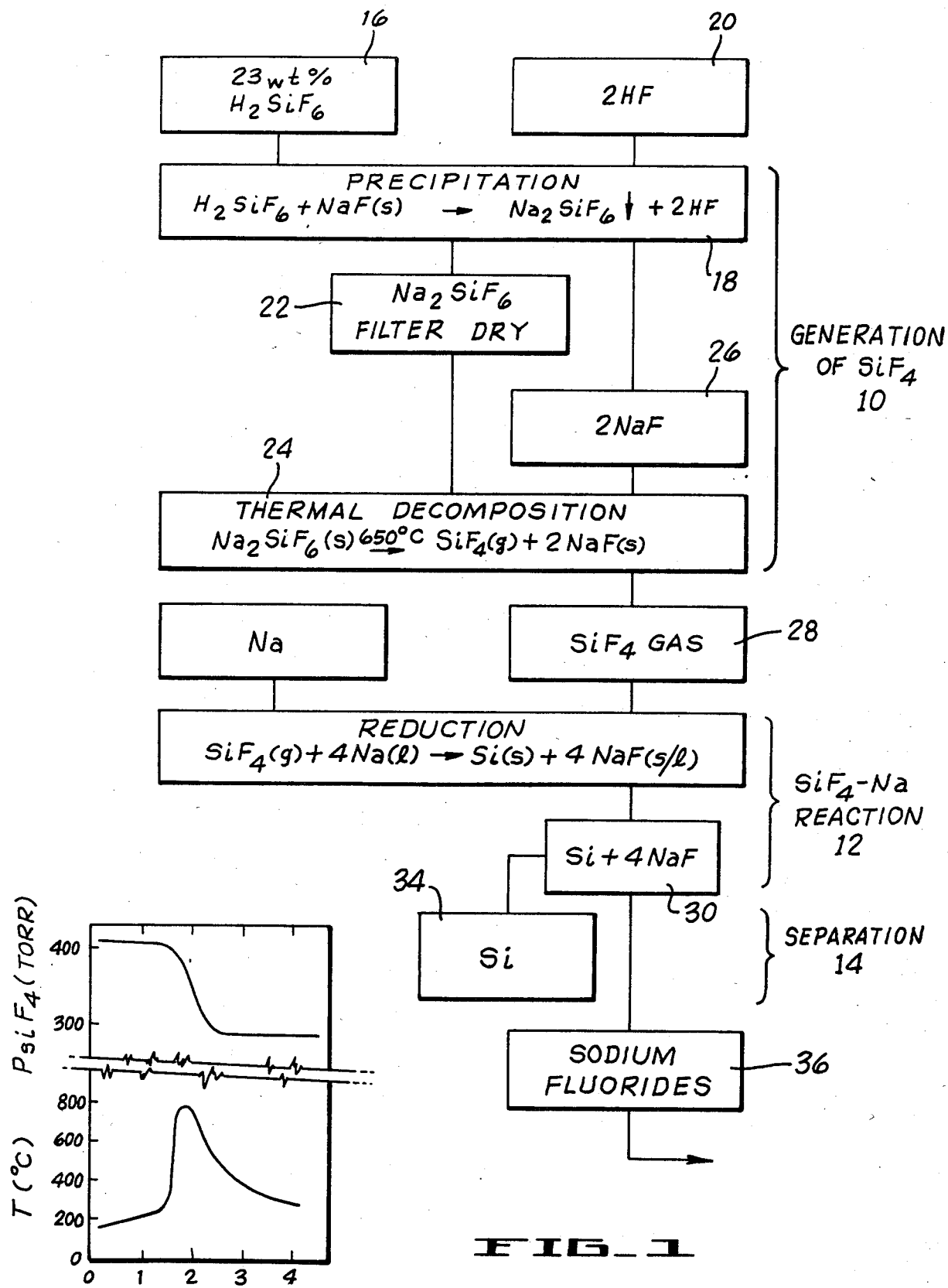

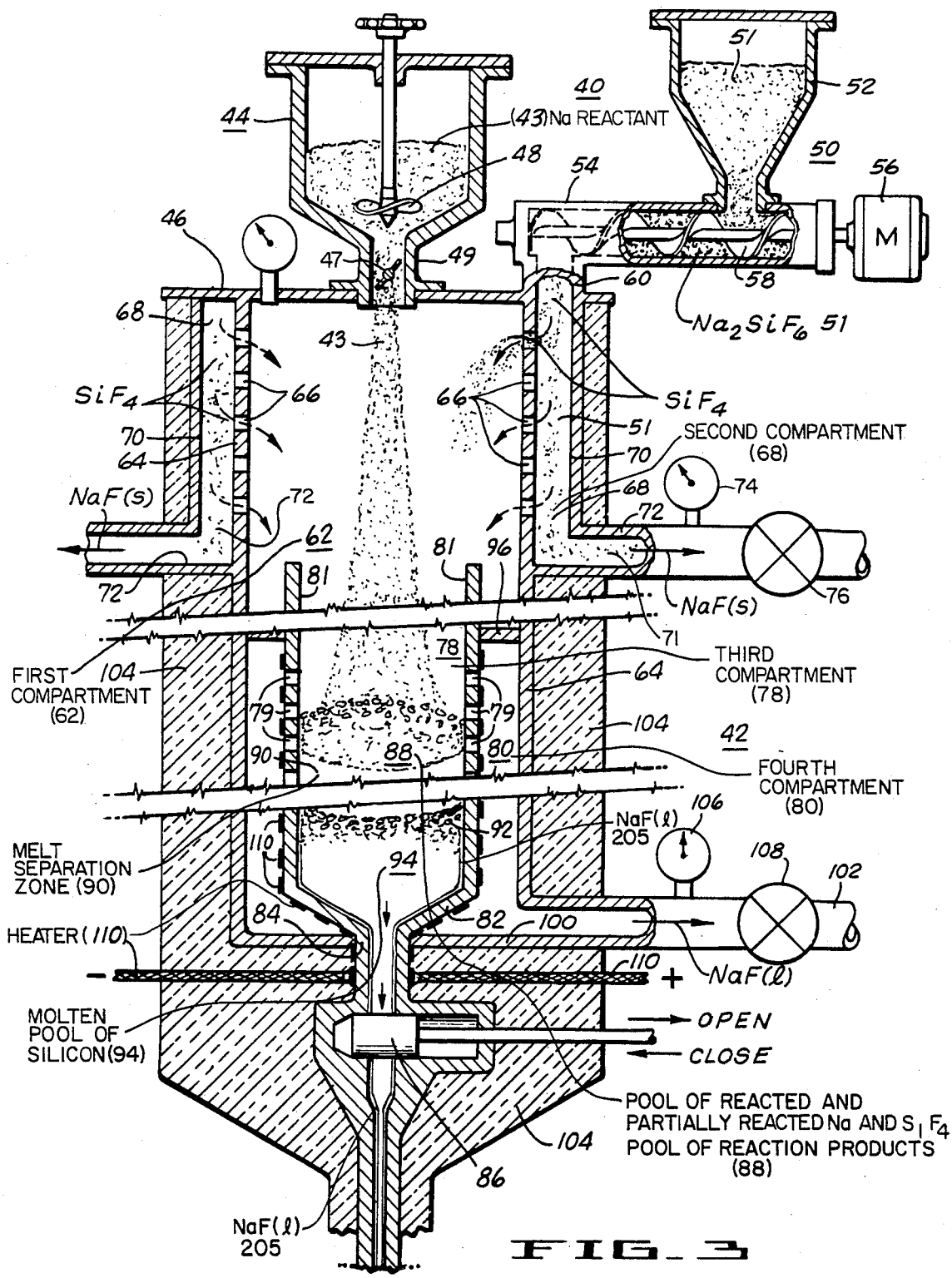

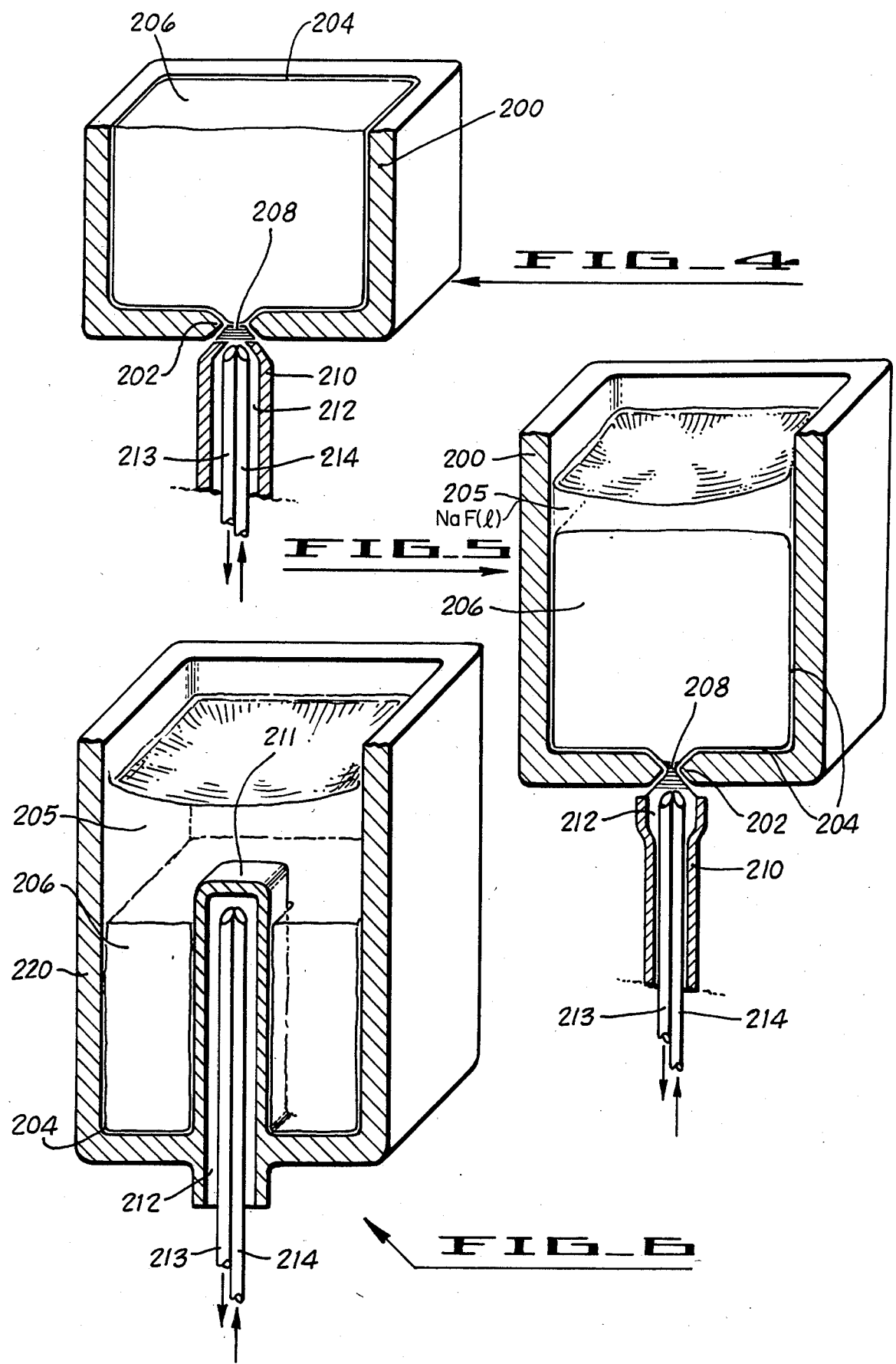

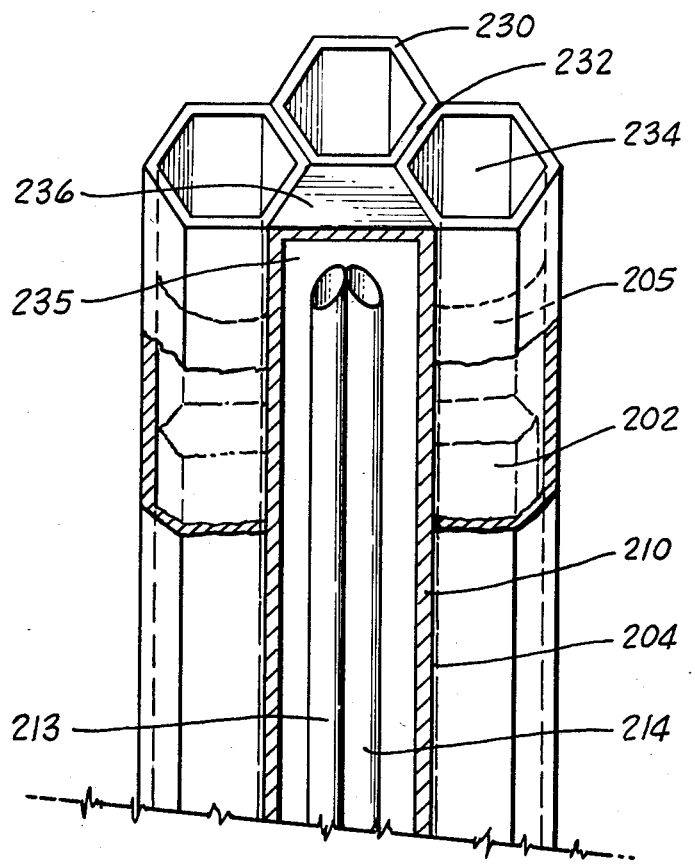
FIG_7
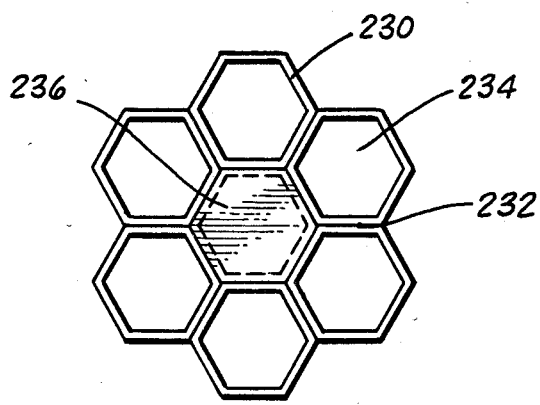
FIG_8

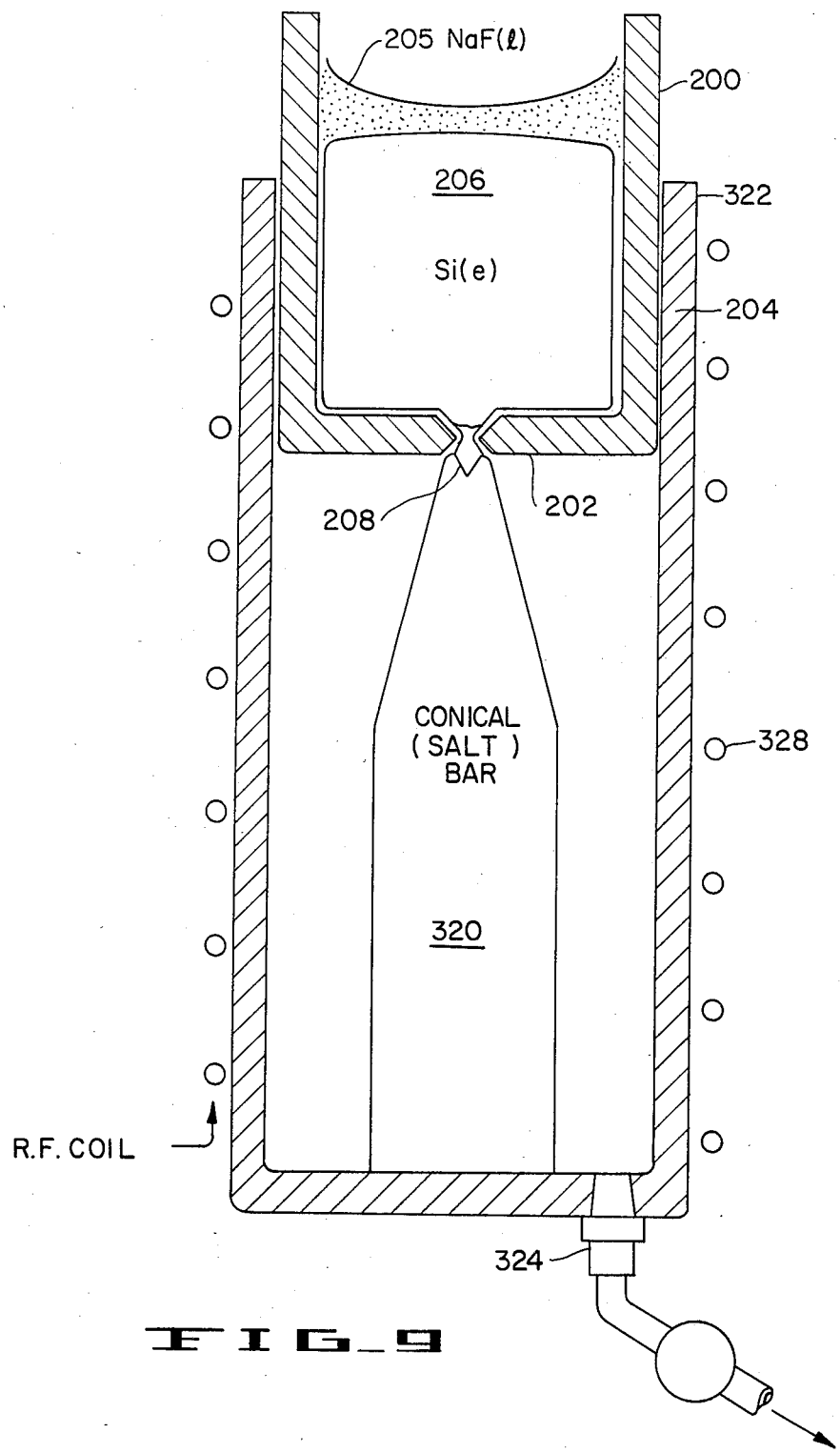
FIG_9

APPARATUS FOR OBTAINING SILICON FROM FLUOSILICIC ACID

ORIGIN OF INVENTION

The United States Government has rights in this invention pursuant to JPL/DOE Contract No. 954471-NAS 7-100 awarded by the U.S. Department of Energy.

BACKGROUND OF THE INVENTION

This invention together with the inventions described in the related applications (cited below) evolved (in-part) from research efforts aimed at preparing low cost, high purity silicon for solar cells. The results of that research are contained in the following reports prepared for JPL/DOE:

Quarterly Progress Report No. 1, "Novel Duplex Vapor-Electrochemical Method for Silicon Solar Cell", by: V. J. Kapur and L. Nanis, August 1976;

Quarterly Progress Report No. 2 and 3, "Novel Duplex Vapor-Electrochemical Method for Silicon Solar Cell", by: V. J. Kapur and L. Nanis, March 1976;

Quarterly Progress Report No. 4, "Novel Duplex Vapor-Electrochemical Method for Silicon Solar Cell", by: V. J. Kapur L. Nanis, and A. Sanjurjo, January 1977;

Quarterly Progress Report No. 5, "Novel Duplex Vapor-Electrochemical Method for Silicon Solar Cell", by: V. J. Kapur, L. Nanis, and A. Sanjurjo, February 1977;

Quarterly Progress Report No. 6, "Novel Duplex Vapor-Electrochemical Method for Silicon Solar Cell", by: V. J. Kapur, L. Nanis, and A. Sanjurjo, March 1977;

Quarterly Progress Report No. 7, "Novel Duplex Vapor-Electrochemical Method for Silicon Solar Cell", by: V. J. Kapur, L. Nanis, and A. Sanjurjo, April 1977;

Quarterly Progress Report No. 8, "Novel Duplex Vapor-Electrochemical Method for Silicon Solar Cell", by: V. J. Kapur, L. Nanis, and A. Sanjurjo, February 1978;

Quarterly Progress Report No. 9, "Novel Duplex Vapor-Electrochemical Method for Silicon Solar Cell", by: V. J. Kapur, L. Nanis, A. Sanjurjo, and R. Bartlett, April 1978;

Quarterly Progress Report No. 10, "Novel Duplex Vapor-Electrochemical Method for Silicon Solar Cell", by: V. J. Kapur, L. Nanis, K. M. Sancier, and A. Sanjurjo, July 1978;

Quarterly Progress Report No. 11, "Novel Duplex Vapor-Electrochemical Method for Silicon Solar Cell", by: V. Kapur, K. M. Sancier, A. Sanjurjo, S. Leach, S. Westphal, R. Bartlett, and L. Nanis, October 1978;

Quarterly Progress Report No. 12, "Novel Duplex Vapor-Electrochemical Method for Silicon Solar Cell", by: L. Nanis, A. Sanjurjo, and S. Westphal, January 1979;

Quarterly Progress Report No. 13, "Novel Duplex Vapor-Electrochemical Method for Silicon Solar Cell", by: L. Nanis, A. Sanjurjo, K. Sancier, R. Bartlett, and S. Westphal, April 1979;

Quarterly Progress Report No. 14, "Novel Duplex Vapor-Electrochemical Method for Silicon Solar Cell", by: L. Nanis, A. Sanjurjo, and K. Sancier, July 1979;

Quarterly Progress Report No. 15, "Novel Duplex Vapor-Electrochemical Method for Silicon Solar Cell", by: L. Nanis, A. Sanjurjo, and K. Sancier, November 1979;

Draft Final Report, "Novel Duplex Vapor-Electrochemical Method for Silicon Solar Cell", by: L. Nanis, A. Sanjurjo, K. Sancier, and R. Bartlett, March 1980; and Final Report, "Novel Duplex Vapor-Electrochemical Method for Silicon Solar Cell", by: L. Nanis, A. Sanjurjo, K. Sancier, and R. Bartlett, March 1980.

The subject matter of the aforementioned reports are incorporated herein by reference.

REFERENCE TO RELATED APPLICATIONS

Other copending United States patent applications relating to the general subject matter of this invention, assigned to the same assignee and incorporated herein by reference are as follows:

Process and Apparatus for Obtaining Silicon from Fluosilicic Acid, Ser. No. 337,136 1 filed Jan. 5, 1982 by Angel Sanjurjo;

Process and Apparatus for Casting Multiple Silicon Wafer Articles, (Ser. No. 453,718) filed even date herewith by Leonard Nanis;

Process and Apparatus for Obtaining Silicon from Fluosilicic Acid, (Ser. No. 453,457) filed even date herewith by Kenneth M. Sancier;

Process and Apparatus for Obtaining Silicon from Fluosilicic Acid, (Ser. No. 453,596) filed even date herewith by Kenneth M. Sancier;

Process and Apparatus for Obtaining Silicon from Fluosilicic Acid, (Ser. No. 453,337) filed even date herewith by Leonard Nanis and Angel Sanjurjo; and Process and Apparatus for Obtaining Silicon from Fluosilicic Acid, (Ser. No. 453,456) filed even date herewith by Angel Sanjurjo, now U.S. Pat. No. 4,442,082 having an issue date Apr. 10, 1984.

FIELD OF INVENTION

Silicon is, at present, the most important material in modern semiconductor technology and is finding increased use in solar cells for the photovoltaic generation of electricity. In view of the importance of the solar cell application, the stringent requirements for purity and low cost and further in view of the orientation of the work done, the process and apparatus is described primarily in the context of production of silicon for solar cell use. However, it is to be understood that both the process and apparatus used are generally useful in the production of silicon for whatever end use, as well as other transition metals such as Ti, Zr, Hf, V, Nb and Ta.

A major deterrent to the development of practical solar photovoltaic systems is the cost of high purity silicon. With todays technology, approximately twenty percent of the total cost of a silicon solar cell is ascribed to the silicon material alone. That is, the cost of the silicon material produced by the conventional hydrogen reduction of chlorosilanes constitutes at least twenty percent of the cost of producing the cell. It is estimated that the cost of the silicon must be reduced by almost an order of magnitude before silicon solar photovoltaic panels will prove to be economically feasible as a power source. The fact that the chlorosilane processes require multiple separations, are so energy intensive and require such large capital investments indicate that cost of the silicon cannot be reduced sufficiently to make silicon solar cells economically feasible without a major process change. As a consequence, an approach to the production of solar grade silicon is required which is less complex, less energy intensive and which requires less capital equipment.

TECHNICAL FIELD OF THE INVENTION

It has been found that silicon of more than sufficient purity to meet the solar cell applications can be produced within the economic requirements from the metallic reduction of silicon fluoride. Preferably, the silicon fluoride is generated from fluosilicic acid, a low cost waste by-product of the phosphate fertilizer industry. In the present invention the silicon fluoride, in the form of gaseous $SiF_4$, is generated by thermal decomposition of the fluosilicic acid and in another system, the silicon fluoride is prepared from an aqueous solution of fluosilicic acid by treatment with a metal fluoride which precipitates the corresponding fluosilicate. In the latter instance the salt is filtered, washed, dried and thermally decomposed to produce the corresponding silicon tetrafluoride and metal fluoride which can be recycled to the precipitation step. The silicon tetrafluoride is then reduced by a suitable reducing metal and the products of reactions are treated to extract the silicon. Each of the steps is described in detail using sodium as typical reducing agent, and sodium fluoride as typical precipitating fluoride but the concept applies as well to other reducing metals and metal fluorides that can reduce silicon fluoride and form fluosilicates.

The process in one form is described in detail in an article entitled Silicon by Sodium Reduction of Silicon Tetrafluoride authored by A. Sanjurjo, L. Nanis, K. Sancier, R. Bartlett and V. J. Kapur in the Journal of the Electrochemical Society Vol. 128, No. 1, January 1981. In a form more closely allied to the present invention, a process is described in an article entitled A Solar Silicon Solution? authored by Scott W. Dailey in Leading Edge Summer 1979. The subject matter of both articles is specifically incorporated herein by reference.

BACKGROUND

There are available systems for the production of silicon utilizing some of the reactions of the present system. For example, Joseph Eringer in U.S. Pat. No. 2,172,969 describes a process wherein sodium silicofluoride is mixed with sodium in powder form and placed in a crucible which is heated and in the upper part of which two pieces of copper wire gauze are placed parallel to each other. The space between the pieces of gauze, which can also be heated, is filled with copper wool. When the crucible has been filled and closed, it is heated to about 500° C. At this temperature, reaction takes place and silicon and sodium fluoride are formed whereby the silicon which is mechanically expelled by the sudden increase in pressure is collected in chambers or towers connected to the furnace.

The equation of the reaction is as follows:

$Na_2SiF_6 + 4Na = Si + 6NaF$ or this can be expressed:

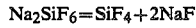
$Na_2SiF_6 = SiF_4 + 2NaF$

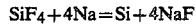
$SiF_4 + 4Na = Si + 4NaF$

After the reaction product has been cooled at least to 200° C. it is finely divided and is treated with water or heat treated with dilute 1:1 sulfuric acid. Hydrogen fluoride gas is liberated (which latter can then be made into hydrofluoric acid or a metallic fluoride) metallic sulphates are produced and the silicon separates out on the surface in amorphous form as shining metallic froth.

The reaction expressed in equation form is:

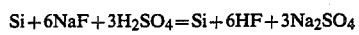
$Si + 6NaF + 3H_2SO_4 = Si + 6HF + 3Na_2SO_4$

After the silicon has been separated from the metallic sulphate solution, it is again washed and is dried at 80° C. The silicon obtained in this way is in the form of an impalpable redish or grey-brown powder which discolors strongly and which, even if the raw products were impure, contains a minimum of 96–97% silicon. The yield amounts to about 87% of the theoretically possible yield.

Robert Aries reports in U.S. Pat. No. 3,041,145 that attempts made to reduce silicon halides by the use of sodium vapor have not led to a commercially successful process. He gives as an example the process discussed in the Eringer patent, supra, and points out 96%–97% purity is entirely outside the range of purity required for silicon to be used for photocells, semiconductor rectifiers, diodes, and various types of electronic equipment. As has already been discussed, the conventional hydrogen reduction of chlorosilanes is too energy intensive to be economical.

Aries ascribes the purity problem to impurities in the sodium used in the reduction reaction and teaches that further elaborate and expensive purification of the purest available commercial grade sodium is required to produce silicon of solar or semiconductor grade. More recently, V. J. Kapur in U.S. Pat. No. 4,298,587 also supports the view that such purification is required. In fact, this patent teaches that both the sodium and the silicon tetrafluoride must be purified using a system as energy intensive as those employed in the chlorosilane reduction processes.

It has been determined that silicon of the desired grade is obtained without the elaborate purification of commercial grade sodium or silicon tetrafluoride obtained from the fluosilicic acid (from the reaction shown above) provided the reduction reaction is carried out in such a way that it goes to completion, the proper environment is maintained during the reduction reaction and the product is properly isolated from contaminating atmosphere and container walls until the reaction is complete and solid silicon which is below reaction temperature is formed and separated.

In copending patent applicaton entitled Process and Apparatus for Obtaining Silicon from Fluosilicic Acid, Ser. No. 337,136 filed Jan. 5, 1982 by Angel Sanjurjo and assigned to the present assignee, the isolation from the container is carried out using a powdered substance so that the reaction product does not adhere and can be removed by a simple dumping process. The system is successful and can be used to aid in prevention of destruction of the silicon ingot casting crucible contemplated for use in the present invention. However, that arrangement generally is not needed in connection with the melt separation of the present process.

Note that Eringer mixes $Na_2SiF_6$ and Na directly in performing the reaction which produces Si. It is generally thought that where both reactants are fed together in a reaction chamber, as a result of the close mixing, some of the impurities in the $Na_2SiF_6$ are transferred to the product silicon. This, at least in part, explains the low purity of Eringer's Si. Commercial grade $Na_2SiF_6$ typically has impurities in the 10 to 100 ppm wt range which make it unacceptable for production of solar grade silicon in most systems without further purification. Although prepurification of $H_2SiF_6$ and careful precipitation of $Na_2SiF_6$ with pure NaF in the presence of complexing agents have yielded $Na_2SiF_6$ with most impurities below the 5 ppm wt level, the Al content generally remains high at 20 to 30 ppm wt levels. As evidenced by both Aries and Kapur, the art would teach that not only the starting materials $Na_2SiF_6$ and Na must be highly purified but the $SiF_4$ resulting from decomposition of the $Na_2SiF_6$ must also be purified if a solar grade Si is to be provided.

The present invention is specifically concerned with performing the reaction in such a manner that the reaction can start with a relatively impure $Na_2SiF_6$, the reaction products (Si and NaF) are formed in essentially a continuous single operation and are easily separated by melt separation and the Si continuously cast in single crystal or quasi single crystal ingots of solar grade.

SUMMARY AND OBJECTS OF INVENTION

In carrying out the present invention sodium fluosilicate $Na_2SiF_6$ is precipitated from fluosilicic acid followed by thermal decomposition of the fluosilicate to silicon tetrafluoride $SiF_4$. The $SiF_4$ is then reduced by an alkali metal, preferably Na, to obtain silicon which is separated from the mix, preferably by melt separation. The reaction is carried out in a continuous procedure and in such a manner that the resulting reaction products (Si and NaF) are easily removed and separated directly and continuously from the melt and the Si may be directly cast and grown as single crystal or quasi single crystal ingots.

The invention has for its principal object the provision of a means for obtaining silicon of sufficient purity to produce solar photovoltaic cells inexpensively enough to make their use practical.

A further object of this invention is to provide a means by which silicon can be obtained which is substantially free of impurities starting with relatively inexpensive and impure fluosilicic acid.

A still further object of this invention is to provide a process and apparatus for producing Si wherein $Na_2SiF_6$ and a reductant, preferably Na, are introduced into compartments of a reactor which compartments have means for vapor transport therebetween and thermally decomposing the $Na_2SiF_6$ so that gaseous $SiF_4$ is transported to interact with the reductant to produce the reaction products Si and NaF.

Another object of the invention is to provide a process for producing solar grade Si by reaction of $SiF_4$ and a reductant as described above and wherein Si is separated from the reaction products continuously and directly.

Still another object of the invention is to provide a process and apparatus for producing solar grade silicon as described above wherein the silicon separated from other reaction products is cast substantially continuously and directly into single crystal or quasi single crystal ingots.

Still a further object of the invention is to provide process and apparatus for continuously separating Si in molten form from the molten reaction products and casting the Si into ingots in the form of single crystal or quasi single crystal ingots or a continuous sheet as it is separated.

Yet another object of the invention is to provide an inexpensive high purity crucible for receiving Si separated from the molten reaction products and forming single crystal or quasi single crystal ingots.

The novel features which are believed to be characteristic of the invention are set forth with particularity in the appended claims. The invention itself, however, both as to its organization and method of operation, together with further objects and advantages thereof may best be understood by reference to the following description taken in connection with the accompanying drawings.

BRIEF DESCRIPTION OF THE DRAWINGS

FIG. 1 is a flow diagram illustrating a preferred embodiment of the process for producing high purity silicon by the melt process;

FIG. 2 is a graph illustrating the time, temperature and pressure characteristics of the silicon fluoride and sodium reaction showing time in minutes plotted along the axis of abscissae and temperature in degrees C. and pressure (torr) plotted along the axis of ordinates;

FIG. 3 is a somewhat diagrammatic central vertical section through a reactor unit showing vapor transport and reaction product separation means and details of one embodiment of a $Na_2SiF_4$ and a $SiF_4$ feed mechanism;

FIGS. 4 through 7, inclusive, are perspective central vertical sections through parallelepiped crucibles, according to the present invention, which may be positioned to receive and case single crystal or quasi single crystal ingots from the Si separated by the separator of the system shown in FIG. 3; and FIG. 8 is a top view looking down on the parallelepiped crucible of FIG. 7 and showing the hexagonal or honeycomb structure.

DESCRIPTION OF PREFERRED EMBODIMENTS

A preferred embodiment of the process for production of pure silicon starting with inexpensive commercial grade fluosilicic acid is illustrated in the flow diagram of FIG. 1. The overall process consists of three major operations which encompass a series of steps. The first major operation (shown in brackets 10 in the drawing) includes the step of precipitation of sodium fluosilicate from fluosilicic acid followed by generation of silicon tetrafluoride gas. The second major operation (brackets 12 on the drawing) comprises the reduction of silicon tetrafluoride to silicon, preferably by sodium, and the third operation (brackets 14) involves the separation of silicon from the mixture of silicon and sodium fluoride.

Consider first the steps for generation of silicon tetrafluoride (operation 10). The preferred starting source of silicon is an aqueous solution of fluosilicic acid ($H_2SiF_6$), a waste product of the phosphate fertilizer industry, that is inexpensive and available in large quantities. Fluosilicic acid of commercial grade [23 weight percent (w%)] has also been used directly as received without purification or special treatment and is shown as the silicon source 16 in FIG. 1. As another alternative, fluosilicic acid is obtained by treating silica, or silicates (natural or artificially made) with hydrogen fluoride. The $SiF_6^{-2}$ is then precipitated in sodium fluosilicate $Na_2SiF_6$, by adding a sodium salt to the solution (step 18). Other salts such as NaF, NaOH, NaCl, or similar salts of the elements in groups IA and IIA of the periodic table are all candidates. The major selection criteria are, low solubility of the corresponding fluosilicate, high solubility of impurities in the supernatant solution, high solubility of the precipitating fluoride salt, and non-hygroscopic character of the fluosilicate.

Based on these criteria, the preferred fluosilicates in order of preference are $Na_2SiF_6$, $K_2SiF_6$ and $BaSiF_6$. Using the preferred NaF as the precipitating salt, the hydrogen of the fluosilicic acid is displaced by the sodium to form sodium fluosilicate, a highly stable, non-hygroscopic, white powder, and sodium fluoride which is recycled. In equation form the reaction is $$H_2SiF_6 + 2NaF = Na_2SiF_6 + 2HF$$

As an example, Sodium fluosilicate was precipitated by adding solid sodium fluoride directly to the as received commercial grade fluosilicic acid 18. The yield was a supernatant liquid containing mostly HF and some NaF and $H_2SiF_6$ along with the sodium fluosilicate. HF is also given off (20). The supernatant fluid was removed and the sodium fluosilicate washed with cold distilled water to remove any remaining HF and $H_2SiF_6$. After filtering and drying in an oven at 200 degrees C., a minimum yield of 92% of pure sodium fluosilicate 22 (determined by x-ray diffraction) was obtained. The product sodium fluosilicate is a nonhygroscopic white powder that is very stable at room temperature and thus provides an excellent means for storing the silicon source before it is decomposed to silicon tetrafluoride.

Precipitation under the just described conditions acts as a purification step, with most impurities in the original fluosilicic acid staying in solution. This effect is increased by adding suitable complexing agents to the fluosilicic acid solution previous to the precipitation. Both inorganic complexing agents such as ammonia and organic agents such as EDTA (ethylenediaminetetraacetic acid) help to keep transition metal ions in solution during precipitation of the fluosilicate.

The fluosilicate is thermally decomposed 24, thus, $$Na_2SiF_6 = SiF_4 + 2NaF$$

to give the solid sodium fluoride, which is recycled 26, and to generate the $SiF_4$ gas 28. The decomposition does not take place appreciably at temperatures below 400° C. Therefore, impurities which are volatile at this temperature can easily be removed by a vacuum treatment below this temperature. The decomposition of $Na_2SiF_6$ takes place at temperatures between 500° and 700° C. Impurities left in the solid phase are typically transition metal fluorides such as Fe, Ni, Cu, etc., whose volatility at temperatures below 700° C. is very low and therefore do not contaminate the $SiF_4$ gas. The gas thus produced can be fed directly to the reduction reactor or it can be stored for future use.

In separate experiments, it was determined that $SiF_4$ gas at a pressure of 0.4 atm is in equilibrium at 650° C. with solid $Na_2SiF_6$ and NaF. Therefore, as $SiF_4$ is needed, the $Na_2SiF_6$ is thermally decomposed (FIG. 1) at 65° C. in a graphite-lined, gas-tight stainless steel retort. Gaseous $SiF_4$ evolved at 650° C. was condensed as a white solid in a storage cylinder (cooled by liquid nitrogen) attached to the retort. The $SiF_4$ gas was allowed to expand by warming of the storage cylinder to room temperature and was fed into the reactor as needed. $SiF_4$ gas prepared in this manner was determined by mass spectrometric analysis to be more pure than commercial grade $SiF_4$, as shown in Table I. Ions formed from the sample gas were identified from the observed mass numbers, isotopic distribution and threshold appearance potentials. The detection limit was better than 0.005%. Positively identified gaseous impurities are listed in Table I; no metallic impurities were detected. Peaks corresponding to B compounds, such as $BF_3$, were specially checked, but none were found.

TABLE I

| | Mass spectrometric analysis of $SiF_4$ | |
|---|---|---|
| Ion | $SiF_4$ prepared from $H_2SiF_6$ | (%) $SiF_4$ commercial (%) |
| $SiF_3^+$ | 96.9 | 93.6 |
| $Si_2OF_6^+$ | 3.04 | 4.24 |
| $SiOF_2^+$ | (—) | 1.79 |
| $CCl_3^+$ | (—) | 0.159 |
| $SiO_2F_2^+$ | 0.076 | 0.098 |
| $Si_2O_2F_4^+$ | (—) | 0.081 |
| $SiO_2^+$ | (—) | 0.035 |

Although the $SiF_4$ produced from $H_2SiF_6$ has less impurity, the commercial grade $SiF_4$ was also used for experimental convenience. The possible presence of metallic impurities in commercial $SiF_4$ was determined by bubbling the gas through high purity water and treating the resulting slurry with an excess of HF to drive off Si as $SiF_4$. The final clear solution was then analyzed by plasma emission spectroscopy (PES). The results are listed in Table II, together with PES analysis of the waste by product $H_2SiF_6$ and the NaF used to precipitate $Na_2SiF_6$ (18 and 22 FIG. 1). Comparison of the first two columns of Table II with column three shows that the concentration of some elements, e.g., Li, B. V. Mn, Co, K, and Cu, were unchanged by precipitation of $Na_2SiF_6$ whereas the elements Mg, Ca, Al, P, As, and Mo were diminished by a factor of 5–10. Some elements were concentrated into the $Na_2SiF_6$, namely Cr, Fe, and Ni. The fourth column in Table II is representative of the impurity content to be found in $SiF_4$ gas prepared on a commercial scale. The low content of P is of special significance for both semiconductor and solar cell applications. Elements known to reduce solar cell efficiency (V, Cr, Fe, Mo) are uniformly low in commercial grade $SiF_4$. Only Mn, As, and Al are of comparable concentration in both $Na_2SiF_6$ and $SiF_4$ at the 1 parts per million (ppm) by weight or less level.

TABLE II

| | Plasma emission spectroscopy analysis, ppm (wt) | | | |
|---|---|---|---|---|
| Element | $H_2SiF_6$ | NaF | $Na_2SiF_6$ | $SiF_4$ |
| Li | 0.1 | (—) | 0.2 | 0.01 |
| Na | 460 | (—) | (—) | 1.8 |
| K | 9.0 | (—) | 8.0 | 0.3 |
| Mg | 55 | (—) | 6.4 | 2.3 |
| Ca | 110 | 10 | 18 | 1.6 |
| B | 1.0 | (—) | 0.8 | <0.01 |
| Al | 8.0 | <2.5 | 1.3 | 1.2 |
| P | 33 | (—) | 5 | 0.08 |
| As | 8.8 | (—) | 0.2 | 0.28 |
| V | 0.3 | <5 | 0.3 | <0.01 |
| Cr | 0.8 | <3.5 | 8.8 | <0.01 |
| Mn | 0.2 | <4 | 0.4 | 0.16 |
| Fe | 13 | <7 | 38 | 0.04 |
| Co | 0.54 | (—) | 0.7 | <0.01 |
| Ni | 1.17 | <8 | 4.2 | <0.01 |
| Cu | 0.12 | <4 | 0.6 | <0.01 |
| Zn | 1.4 | (—) | 1 | <0.01 |
| Pb | 14.5 | (—) | 5 | 0.03 |

TABLE II-continued

| | Plasma emission spectroscopy analysis, ppm (wt) | | | |
|---|---|---|---|---|
| Element | $H_2SiF_6$ | NaF | $Na_2SiF_6$ | $SiF_4$ |
| Mo | 11 | (—) | 1.0 | <0.01 |

$SiF_4$/Na reaction, the central operation of the pure Si process, (FIG. 1) is the reduction of $SiF_4$ by Na according to the reaction $SiF_4(g) + 4Na(l) = Si(s) + 4NaF(s)$ This reaction is thermodynamically favored at room temperature, however, it has been found experimentally that Na has to be heated to about 150° C. before any appreciable reaction can be observed. Once the reaction has been initiated the released heat raises the temperature of the reactant (Na) which in turn increases the reaction rate. Under adiabatic conditions, a temperature of 2200 K. is predicted for the reaction with the stoichiometric quantities of $SiF_4$ and Na. In practical reactors, rapid consumption of gaseous $SiF_4$ produces a pressure decrease. The kinetic behavior of the Na-$SiF_4$ reaction is complex because of the interplay of several factors, e.g., pressure of $SiF_4$, vaporization of Na, local temperature, porosity of two solid products, and transport of $SiF_4$ and Na vapor through the product crust that forms on the liquid Na.

Although only preliminary studies have been made of the kinetics, the general features of this reaction have been surveyed. In a series of experiments to estimate reaction temperature 5 grams of Na were loaded in a Ni crucible (3 cm ID, 4 ccm high) and heated in $SiF_4$ initially at 1 atm pressure. The Na surface tarnished at around 130° C., with the formation of a thin brown film. As the temperature increased, the color of the surface film gradually changed from light brown to brown and finally to almost black. The $SiF_4$/Na reaction became rapid at 160° +/−10° C. and liberated a large amount of heat, as indicated by a sudden rise in reaction temperature. See FIG. 2 for reaction time, temperature, pressure characteristics. The pressure in the reactor typically decreased slightly until the temperature increased sharply, with an associated rapid decrease in $SiF_4$ pressure. The reaction lasts for several seconds only (until the Na is consumed). For $SiF_4$ pressures below 0.3 atm the reaction mass was observed to glow at a dull red heat. For higher pressure, a characteristic flame was observed. The shortest reaction time (20 sec) and the highest temperatures (about 1400° C.) were obtained when the initial pressure of $SiF_4$ was around 1 atm. In addition, complete consumption of Na was obtained for 1 atm $SiF_4$. When scale-up of this reaction was attempted by loading larger amounts of Na, it was found that as the depth of the Na pool increased, the amount of Na remaining unreacted also increased. The product formed a crust on top of the Na surface, building a diffusion barrier for the reactants. As the barrier thickness increased, the reaction slowed and eventually stopped.

For separation (operation 14 FIG. 1) of the silicon from the products of reduction, in the preferred melt separation process embodiment of this invention, the products are heated until a melt is formed and the NaF is drained off (36) leaving the Si (34) which can if necessary be further purified. The melting and separation process is described in detail below in connection with the scaled up system. Leach separation is described in the copending Sanjurjo application previously referenced. In the leach process, the silicon and sodium are removed and combined with water and a selected acid. The resultant silicon and water soluble sodium fluoride are then separated.

On the bases of studies of the parameters that affect the reaction and are effected by the reaction as described in connection with the work reported above, the present system was conceived. It was considered possible to simplify the process and apparatus by reducing the steps to a minimum and at the same time produce a high purity product (Si). With this in mind and to obtain Si as pure as possible an experiment was carried out with a reactor design in which Na was loaded in a copper cylindrical cup 1.5 inches diameter by 4 inches high (not shown). The cup was then placed in an alumina ($Al_2O_3$) tube 2.5 in diameter (not shown). Sodium fluosilicate was added in the annular space between the copper cup and the alumina tube. Thus, the reactants were separately loaded in two concentric compartments, divided laterally by a copper wall. This geometry allowed for an efficient heat transfer from the inner (cup of Na) compartment to the outer (tube of $Na_2SiF_6$) compartment and allowed for easy vapor transport to the sodium. This system was placed in a stainless steel reactor (not shown), which was then evacuated and backfilled with argon. The reactor was heated to 500° C. and reaction took place in the inside compartment, as indicated by an increase in temperature.

X-ray analysis indicated that after the reaction, the inner compartment (copper cup with Na) contained Si and NaF and that the outer compartment (alumina tube) contained NaF and $Na_2SiF_6$. From this information, it was concluded that during the initial heating, $SiF_4$ (g) is generated by $Na_2SiF_6$ decomposition. The $SiF_4$ (g) reaches the liquid Na and reacts with it to produce silicon and to liberate heat. As heat is released, $Na_2SiF_6$ is decomposed further, generating more $SiF_4$ (g). The synergistic process continues until one of the reactants has been depleted.

The overall reaction is very fast (order of seconds) for 10 grams of Na. The pressure build-up is minimal (less than 3 atm) and is due partially to the thermal expansion of argon initially present at 1 atm. In addition, some insight into the mechanism by which the reaction takes place has been gained by experimentally demonstrating the presence of $SiF_4$ (g) as an intermediate.

It has been observed (as previously pointed out) that at $SiF_4$ pressures greater than 0.5 atm, the $SiF_4$-Na reaction products obtained have the best yield, morphology, and composition. To obtain this pressure of $SiF_4$ from the decomposition of $Na_2SiF_6$ it is necessary to heat the salt to temperatures around 700° C. At this temperature the rate of decomposition is very fast and thus a small residence time is required for total decomposition. Finally, the formation of NaF-$Na_2SiF_6$ molten mixtures should be avoided, since it decreases the activity of the fluosilicate and thus decreases its pressure of decomposition. Thus, temperatures of decomposition should be kept near, but not above about, 700° C.

This information has been used to design reactors for a continuous production of silicon such as the one shown in FIG. 3. The system is essentially a single continuous process for producing low cost, high purity solar grade silicon ingots in single crystal or quasi single crystal ingot form in a substantially continuous operation in a two stage reactor starting with sodium fluosilicate and a reductant in separate compartments. The separate compartments have provision for easy vapor transport therebetween. The sodium fluosilicate is decomposed thermally to cause vapor transport of SiF$_4$ between the compartments and thus, the formation of substantially pure silicon which may be continuously separated from the reaction products and directly and continuously cast from the melt.

In addition to the advantages of the continuous process, such a system uses the heat generated by the reaction itself to decompose the feeding salt and to heat up the reaction products. As already pointed out the reaction is highly exothermic and the heat generated is considerable. Therefore, use of the heat generated in this manner takes advantage of the energy which would otherwise require external sources. A further advantage is that the in situ thermal decomposition step provides a purification step for the SiF$_4$ because other metal fluorides are not volatile.

A central vertical section through a two stage reactor and melt separator according to the present invention is illustrated in FIG. 3. The upper section 40 of the reactor system, shown somewhat schematically, constitutes a reactant (Na and Na$_2$SiF$_6$) dispenser or delivery system and the lower section 42 is the reactor and melt separator section where the reaction and melt separation takes place. The reactant Na can be fed into the reactor section 42 alone as pellets or as a liquid or it can be premixed with the reactant Na$_2$SiF$_6$ and the two reactants fed in together. Premixing the reactants eliminates some of the advantages described above and, therefore, is not a preferred embodiment. Consequently, in this (preferred) illustrated embodiment, the reactant dispenser section 40 is designed to feed the two reactants into the reaction section 42 separately. In the illustrated embodiment, provision is made for the Na to be delivered separately as relatively small pellets.

In order to accomplish the separate Na delivery, reactant delivery section 40 includes a sealed stainless steel sodium pellet (43) holding and delivery hopper 44 vertically and centrally located on the top flange 46 of the reactor. The Na holding and delivery hopper 44 is provided with a conventional stainless steel feeding propeller 48 for controlling in or near a delivery throat section 49 for controlling Na flow into the reactor section 42. The inner diameter of the Na injection throat section 49 and injection propeller size and speed are selected to provide the desired Na delivery. A valve (not shown) is provided that allows the hopper 44 to be recharged while the reactor is in operation (kept under a SiF$_4$ atmosphere) is provided. In order to prevent hot particles or gas from reaching the unreacted Na in the feed hopper 44, a throttle 47 is provided in the hopper feed throat section 49.

Delivery of the reactant Na$_2$SiF$_6$ into the reactor section 42, is carried out by a separate Na$_2$SiF$_6$ dispenser (delivery system) 50 positioned and sealed to the top flange 46 (right side in the figure). The delivery system for the Na$_2$SiF$_6$ (51) includes a Na$_2$SiF$_6$ holding and dispensing feed hopper 52 positioned (upper right in drawing) on and sealed to a feed tube 54 which is provided with an internal motor (56) driven flight or screw drive 58. The opposite end (left in drawing) of the feed tube 54 is sealed to the top flange 46 of the reactor section 42 and further is provided with an open feed throat 60 so that as the motor 56 drives the flight 58, Na$_2$SiF$_6$ fed from the hopper 52 is driven in the feed tube 54 toward the reactor 42 (left in the drawing) and into the reactor section 42 through the feed throat 60. The rate at which the Na$_2$SiF$_6$ is fed into the reaction section 42 is determined by the speed of rotation of the screw drive 58.

Next consider the structure of the reactor and melt separator section 42 of the system. In keeping with the experiment described above, the reactor section 42 illustrated is designed so that the reactant Na 43 delivered from the delivery throat 49 of the Na feed hopper 44 enters a compartment (first compartment) or chamber 62 in the top center of the reaction section 42. The Na receiving chamber 62 has its outer dimension defined by a cylindrical reactor main wall 64 which may be of high purity graphite and which extends essentially the full height of the reactor section 42. The part of the main wall 64 surrounding the Na receiving compartment or chamber 62 is formed with apertures or passages 66 therethrough. The passages 66 are of a size to allow vapor transport but prevent the passage of Na$_2$SiF$_6$ or NaF either in solid or liquid form. This may be accomplished either by making this part of the reactor section main wall 64 porous or by producing apertures of a size between about 0.001 mm and about 0.1 mm.

Also in keeping with the experiment described above, the reactor section 42 illustrated is designed so that the reactant Na$_2$SiF$_6$ 51 delivered from the delivery throat 60 of the Na$_2$SiF$_6$ feed hopper 52 enters a compartment (second compartment) or chamber 68 which surrounds the top center of the reaction section 42. Thus, the Na$_5$SiF$_6$ receiving chamber (second chamber) 68 has an inner diameter defined by the upper porous portion of the main reactor wall 64 which also defines the outer diameter of the Na receiving chamber 62. In other words, the Na and Na$_2$SiF$_6$ receiving chambers, 62 and 68 respectively, have a common wall 64 which is formed with apertures or passages 66 therethrough that are of a size to allow vapor transport. The important point here is that vapor transport take place freely between the two (second and first) compartments 68 and 62.

The inner wall 64 of the Na$_2$SiF$_6$ receiving chamber 68 (second chamber) is circumscribed by another high purity graphite cylinder 70 which is spaced therefrom and concentric therewith. The spaced and concentric cylinder 70 forms the outer wall of this (second) chamber 68. Na$_2$SiF$_6$ receiving chamber 68 is closed at its top by the top 46 of the reactor section 42 except for the open Na$_2$SiF$_6$ delivery throat 60 and is closed around its bottom with an annular ring-like bottom 71 of the same material as the cylindrical sides 64 and 70. Drainage for liquid NaF and impurities from the bottom of the Na$_2$SiF$_6$ receiving chamber 68 is provided at opposite sides of the bottom by drainage ports 72. Each of the drainage ports 72 is provided with pressure gages 74 and pressure regulating valves 76 (one of each shown on drain at right side of drawing). If required, separate heating means such as electrical heating coils (not shown) are provided around the outer wall 70 of the Na$_2$SiF$_6$ receiving chamber 68 to start the thermal decomposition and produce the SiF$_4$ reactant.

Consider now the part of the reactor section 42 described to this point. The Na$_2$SiF$_6$ 51 is fed in the outer (second) chamber of the reactor section 42 where it is thermally decomposed to SiF gas and NaF liquid just as in the experiment described above. The vapor (SiF$_4$) is transported through the porous inner wall 64 of the outer chamber 68 into the Na receiving chamber 62 where it reacts with the Na to produce Si according to:

$$SiF_4 + 4Na = Si + 4NaF$$

and in the process releases 164 kcal/mol of $SiF_4$ which are used to decompose more $Na_2SiF_6$ and heat up the products. The adiabatic temperature for the total reaction ($Na_2SiF_6 \rightarrow Si$) being near 1300° K. The high temperatures produced are expected to keep the pressure of the outer chamber well above 1 atm and the reaction (equation above) will keep the pressure of $SiF_4$ in the inner reacting chamber 62 below 1 atm. A $SiF_4$ flow from the outer to the inner chamber should protect the graphite walls by preventing Na from reaching them.

The reduction reaction (FIG. 1 operation 12) takes place in the inner chamber 62 (first compartment) and may go to completion in the lower part, i.e., in the upper part of the reaction product separating chamber or compartment 78 (third compartment) which is in the lower part of reactor section 42. The two inner compartments 62 and 78 do not have a sharp defining line between them, however, it simplifies the description and understanding of the process to consider the two chambers 62 and 78 as separate. In any case, the reaction product separation definitely and completely takes place in the lower inner compartment 78 as described below.

It is contemplated that the reaction products (NaF and Si) will be separated by a melt process at temperatures above the melting point of Si (1412° C.) and preferably about 1420° C. or at least in the range between about 1415° and about 1500° C. It is also contemplated that the separation and removal of the reaction products will take place on a continuous basis. The physical structure and configuration of the reactor portion 42 of the system is designed to produce such results. Note that the melt separation can be accomplished as described in the copending patent application (Ser. No. 453,456, now U.S. Pat No. 4,442,082 having an issue date Apr. 10, 1984), supra., however, a preferred embodiment is illustrated here.

As illustrated, the lower part of the reactor section 42 includes a double container or compartment arrangement with an outer generally cylindrical container 80 (fourth compartment or chamber), designed to capture and dispense the liquid NaF reaction product, surrounding the inner cylindrical reaction product receiving and separating container 78. In order to withstand the high temperatures involved and to avoid contaminating the reaction products, the outer wall 81 of the inner container 78 is composed of high purity graphite and in order to perform the separation of reaction products, the container wall 81 is made with small continuous perforations 79. The bottom 82 of the container 78 is generally conical in shape with a solid nonporous cylindrical molten Si removing drain pipe 84 in the center and thus, has the appearance of a common funnel. The drain pipe 84 is shown closed by a movable drain plug 86. The condition illustrated is for a normal run in process with reaction products built up and some melt separation products in place.

The Na and $SiF_4$ mix and react in the upper inner container or compartment 62 and continue to drop into the lower inner reaction and melt separation compartment or chamber 78. As the reaction proceeds, a pool 88 of reacted and partially reacted Na and $SiF_4$ form where the reaction goes to completion. Immediately below the pool of reaction products 88, a hotter melt separation zone 90 is formed. The melt separation zone 90 is maintained at a much higher temperature (means of heating explained below) than the reaction products zone 88 above it and the reaction products effectively melt out. At these temperatures, i.e., temperatures above 1412° C. the reaction products (Si and NaF) are liquids which are separable because the NaF will normally float on top of the Si. That is, the liquid Si, which is more dense than NaF, agglomerates and settles to the bottom of the reaction product separating chamber 78. Liquid NaF, which melts at 993° C., is immiscible with Si and usually wets graphite in the presence of liquid Si. The more or less spherical globules 92 of Si dispersed in NaF 88 and the large Si ingot or pool 94 at the bottom, as illustrated in FIG. 3, look much like those actually found in a sectioned graphite container after the reaction products, heated to the temperatures contemplated here, have been allowed to cool (solidify). It is apparent that, while molten, the NaF both coats the Si and wets the graphite, thus, providing a barrier which prevents the Si from reacting with the graphite and avoids any impurity transfer or migration through and from reactor walls.

In view of the heat requirements for melt separation of the reaction products, the inner melt separation chamber 78 alone can be heated. In the embodiment illustrated, the outer perforated graphite wall 81 is coated with SiC and a Grafoil strip 110 is wrapped around the wall and used as an electrical heater to elevate the temperature of the reaction products (temperatures discussed above). Electrical connections (labeled + and − in the drawing) are provided by thick graphite rods brought out through the insulation 104 at the bottom of the reactor section 42.

Due to its relatively high surface tension (relative to NaF), Si remains in a porous or perforated container 78 while the low surface tension NaF flows out the pores or perforations 79 provided the pores are of the proper size for the temperatures of the reaction products. It has been determined experimentally that for the melt zone temperatures contemplated, perforations in the wall 81 of the inner reaction product receiving and separating container 78 of between 2 and 3.5 millimeters (mm), the NaF flows through the perforations (now shown) while the molten Si remains in the container 78. The average dimension of the perforations 79 may be from less than 0.5 mm to about 3 mm or greater, preferably between about 0.2 mm to about 3.5 mm, more preferably between about 1 mm to about 3.5 mm, and most preferably between about 2 mm to about 3.5 mm. If the perforations are appreciably smaller than 2 mm, the NaF does not discharge well unless pressure is applied and for apertures appreciably greater than 3.5 mm Si has a tendency to enter and interfere with NaF discharge.

The Si is removed by extracting the movable closure plug 86 to allow the Si to flow out of the reaction container drain pipe 84. The flow is preferably adjusted so that the process is continuous. That is, the flow of Si out the pipe 84 is adjusted so that the reduction reaction is continuously taking place in the reactor and reaction products continuously settle through the reaction product zone 88 and into the melt separation zone 90 with NaF continuously flowing out the perforated inner reaction compartment 78 and Si agglomerating at the bottom and being continuously withdrawn from the drain pipe 84.

The generally cylindrical outer container 80 of the reactor section 42 performs the functions of collecting and dispensing the NaF (separated reaction product) and its outer wall (main wall 64) physically supports the inner graphite reaction product receiving and separating container 78 and the insulation 104 which minimizes radiation heat loss over the entire reactor and separator section 42. The functions performed by the outer container 80 in large measure prescribe the characteristics of the material used and its structure. For example, the fact that the container 80 collects and dispenses the NaF reaction product which seeps through the perforations 79 in the inner product collecting and separating chamber 78 makes it desirable to make the the container of a material which will not slough off, react with the hot NaF, or in any way introduce contaminates which would prevent the NaF from being recycled without being purified. It is also desirable that the outer wall (main wall 64) of outer container 80 be spaced far enough from the outer wall 81 of the inner container 78 to provide free flow for the NaF. The walls 64 and 81 of the two containers 80 and 78 are held in their spaced relationship at the top by means of an annular graphite ring 96 which snuggly surrounds the inner container 78 near its top and fits tightly inside the outer main wall 64 of container 80 and at the bottom by means of the reaction container drain pipe 84 which is sealed in the exit aperture 98 in the bottom 100 of the outer container 80. The NaF is discharged through a drain pipe 102 at the bottom (right side in drawing) of the outer container 80. For control purposes, the NaF discharge pipe 102 is provided with a pressure gage 106 and a conventional valve 108.

As indicated above, high purity graphite meets the criteria for outer main wall 64 of the reactor section 42. Silicon carbide (SiC) is a material which also meets the criteria for the container 80. If SiC is used, however, it should be lined with graphite, Si or another noncontaminating powder as taught in the copending Sanjurjo patent application (Ser. No. 337,136), supra., to assure that no contaminants are added to the reaction products from the container walls. Beryllia (BeO) is also a high strength ceramic which meets all of the above criteria for the outer container 80.

The Si discharged via the exit pipe 84 may be treated in any number of ways. For example, it may be cast into wafers (see copending patent application (Ser. No. 453,718), or continuously cast into sheet (see copending patent application (Ser. No. 453,456, now U.S. Pat. No. 4,442,082 having an issue date Apr. 10, 1984) but, as illustrated, it is cast into single or quasi single crystal ingots by a preferred technique. In order to form the Si ingots, the Si exit pipe 84 (below the blocking plug 86) discharges the molten Si into graphite crucibles as described below. Since the Si in the inner reaction product receiving and separating container 78 is in the presence of NaF salt and the salt wets the Si but not the graphite (as explained above) formation of SiC is prevented. As the Si is discharged through the discharge pipe 84, the salt (NaF) coats and isolates the Si from the pipe wall throughout its length.

The apparatus of the instant invention for casting one or more single silicon crystals or "quasi" single silicon crystal (ingots) comprises at least one graphite crucible with a molten salt coating. Such a casting system is characterized by reduced cost, reusability, and manufacturing versatilely. The casting crucible may be of any desired shape, such as a parallelepiped (right rectangular prism, cube, hexagonal and the like).

The molten silicon 94 is directed into a high purity graphite casting crucible 200 having a configuration of a parallelepiped (a right rectangular prism as illustrated in FIGS. 4 and 5) and continuously cast into a single silicon crystal in accordance with one embodiment of the present invention.

Other suitable parallelepiped crucible configurations useful in the present invention may be a square doughnut shape crucible 220 (see FIG. 6). The crucible 220 is constructed so that a cooling tower 211 is positioned centrally to facilitate directional cooling of the molten silicon. Another suitable crucible configuration useful in the instant invention may be in the form of a multi-compartment crucible 230 with six adjointing hexagonal parallelepipeds (see FIG. 7). The multi-compartment crucible 230 may be constructed so that each of two adjacent hexagonal parallelepiped share a common side wall 232 and a cooling parallelepiped 236 extends up centrally within the six parallelepipeds crucibles so as to form an assembly of hexagonal prism structures capable of casting six single crystal or quasi single crystal ingots each in the shape of a hexagonal prism. The cooling parallelepiped 236 walls are parallel to the corresponding lateral faces of adjacent crucibles and forms a hollow cavity 235 so as to provide cooling from the center to the surrounding crucibles facilitating solidification of the molten silicon.

High purity Grafoil and/or Grafelt (not shown) can be utilized as liners providing a flexible wall against which the solidifying silicon 206 (FIGS. 6 and 7) may expand without fracturing the crucible walls. Normally silicon 94 is introduced into the crucible together with a small amount of NaF (typically about 10% by weight). The NaF 205 and 204 (FIGS. 5, 6, and 7) also serves to absorb stress between solidifying silicon (206) and graphite walls so as to prevent fracture of the crucible walls during solidification of the crystal or quasi-crystal. Low melting salts (e.g., $KNO_3$, $NaNO_3$ and the like) may be mixed with the NaF to decrease the solidification temperature of the salt mixture so as to allow the crystaline ingot to be dumped at a lower temperature and further reduce any residual stress.

The crucible after filing is next covered by a lid and heated in a furnace by resistance or induction heating (not shown). The heated crucible containing silicon 206 (FIGS. 6 and 7) is kept at a temperature of about 1420° C. for about 15 minutes and slowly cooled in stages to about 1412° C. or below. A silicon seed 208 is placed in contact through an orifice 202 at the bottom of the crucible (by removing a graphite plug centrally located at the bottom of the crucible not shown). Alternatively, a silicon seed 208 embedded on a sliding graphite member (not shown) may be utilized to contact the molten silicon 202 (FIGS. 6 and 7). It is contemplated that the NaF layer 204 surrounding the molten silicon 206 may be of great advantage in the seeding process by improving thermal contact of the seed 208 material with the molten silicon 206 (FIGS. 6 and 7).

In accordance with the practice of the instant invention, cooling of the molten silicon 206 (FIGS. 6 and 7) will be provided by He gas flow (similar to conventional HEM methods). Casting of silicon by one working of the (HEM) technique are described in "Heat Exchanger Method-Ingot Casting/Fixed Abrasive Method-Multi-wire Slicing Phase II" Final Report by F. Schmid, et al., Crystal Systems Inc., June 1979; and "Silicon Ingot Casting-Heat Exchanger Method (HEM)/Multi-Wire Slicing-Fixed Abrasive Slicing Technique (FAST) Phase IV" Quarterly Progress Report No. 3, by F. Schmid, et al., Crystal Systems, October 1980. The subject matter of the above cited publications are incorporated herein by reference.

As the solidification proceeds, fracture of the crucible is prevented by the combination of spongy Grafoil lining the crucible wall and molten NaF. Alternatively, a slight taper of about 30° of the crucible walls may allow for easy removal after complete solidification of the molten silicon 206 (FIGS. 6 and 7) column(s). It is expected that the Grafoil liners will stick to the ingot 206 via a solid layer of NaF 204 if the crucible is allowed to cool to room temperature.

Consequently, the crucible should not be allowed to cool below about the melting point of NaF so that the resulting silicon 206 (FIGS. 6 and 7) ingot may be readily removed by dumping.

The salt coating 204 remaining on the ingot can be easily removed by a conventional aqueous leaching process. For example, the salt coating 204 is readily removed in 1.0N acid solution. For a discussion of aqueous leaching of Si, see copending Sanjurjo patent application Ser. No. 337,136 entitled Process and Apparatus for Obtaining Silicon From Fluosilicic Acid filed Jan. 5, 1982 and assigned to the assignee of the present invention.

The method of the present invention is advantages in that NaF serves as an impurity sink (i.e., the molten coating salt acts as a purifying agent). NaF and other salts such as $CaF_2$, $BaF_2$, $Na_2SiO_3$ and mixtures thereof may be utilized to decrease vaporization and increase purification of the molten silicon 206 (FIGS. 6 and 7). This effect adds to the versatility of the casting technique. That is, the fact that the additional purification is obtained allows the casting technique to be used with relatively inexpensive feed grades of Si that would not normally be considered for a solar grade end product. The salt lining 204 or interface may be continuously purged with fresh (purer) NaF to remove any impurities. An additional advantage of the NaF coating 204 is its ability to form a continuous smooth surface between the silicon 206 and the crucible wall so as to prevent any irregularities of the wall surface to affect the crystalization of the silicon 206 ingot.

In accordance with another embodiment of the present invention, cooling of the molten silicon 206 (FIGS. 6 and 7) column(s) is performed at a point immediately below the liquid-solid silicon interface (as illustrated in FIGS. 6 and 7). As the solidification progresses upward from the bottom, the cooling He gas (inlet 214 and outlet 213) probe (see FIGS. 6 and 7) is raised thus overcoming the disadvantage of removing heat through the length of the already solid portion of the solidified silicon 206 (FIGS. 6 and 7) column(s). The cooling He gas probe consists of a pair of tubular members open to the inside of the hollow cooling parallelepipeds (235 and 212), one of the pair of tubular members constituting a coolant delivery tube (inlet 214) for delivery of a liquid coolant and the other tubular member of the pair constituting a coolant removal tube (outlet 23) for removal of coolant after delivery by the delivery tubular member. Seeding and cooling gas probes having different configurations may also be utilized in carrying out the present invention. Other suitable gasses useful in the practice of the invention are Ne, Ar, Kr, Xe, Rn, or N.

In accordance with another aspect of the present invention, a suitable salt having an endothermic transition temperature below about 1400° F. is utilized to provide a suitable heat sink for cooling the molten silicon column (206). The enthalpy of melting for silicon is about 12 kcal/mol and for NaF the number is about 7.97 kcal/mol, which means that about 67% of the heat of solidification of 1 mol of silicon can be absorbed by 1 mol of NaF. It is therefore advantages to contact and extract heat from the molten silicon column (206) using a salt material (such as NaF) which is in the solid state and at a temperature well below the melting point of the salt. A typical configuration of the salt material (not shown) useful for removing heat from the molten silicon column (206) may be in the shape of a conical bar (320) (similar to the shape of a rocket nose cone) constructed of compacted NaF powder. In accordance with the practice of the instant invention, a substantially solid conical bar (320) with a suitably shaped silicon seed embedded at its tip (FIG. 9) is placed within a SiC receiving crucible (322) (similar to a rocket positioned inside a silo with its nose cone aimed upward). The molten silicon (206) column contained within its crucible (200) is then slowly lowered into the upright SiC receiving crucible (322) containing the conical salt bar (320) (similar to a cylinder shaped elevator moving downward into a cylinder shaped coal mine shaft). As the crucible containing the molten silicon (206) proceeds downward into the SiC receiving crucible (322), the tip of the conical bar comes into contact with the molten silicon crucible (200) through the bottom orifice. The contact of the seed 208 with the molten silicon (206) result in the melting of the solid NaF conical bar and crystallization of the molten silicon (206) column.

As the NaF bar melts, it fills the SiC receiving crucible (322) until the original NaF bar is completely melted and transformed into a shape conforming to the shape of the internal SiC receiving crucible (322). The advantages of this method of cooling the molten silicon (206) column are many. Aside from realizing a lower cost and conservation of material, the cooling method is more efficient since the total surface area of the silicon crucible is utilized for removing heat. It is contemplated that the rate of solidification and thus the degree of crystallinity of the resulting silicon column (206) can be controlled by varying the shape of the salt bar, the overall geometry of the system and the rate of any externally applied heat means (328) to the system. Alternatively, heat from the molten silicon column (206) may be removed by a fluidized bed method in which suitable particles of salt in suspension are melted in contact with the bottom of the silicon crucible. The resulting molten salt may be tapped out or they may be allowed to remain molten and converted back into its solid state by additional heat extraction using suitable external heat exchangers.

The process sequence shown in FIG. 1 was selected because of the inherent simplicity of the steps and their independent and combined suitability for scale-up. Some purification occurs during precipitation (operation 1, FIG. 1) for Mg, Ca, Al, P, and As due to the high solubility of their fluosilicates and fluosalts. Some concentration takes place for Cr, Fe, and Ni, and this effect may be due to coprecipitation of these elements as fluorides since their fluosilicates are very soluble. From Table II, it is clear that most of the purification is accomplished as a result of the thermal decomposition in step 24 (FIG. 1). Most transition metal fluorides are in very stable condensed phases at the decomposition temperature (850° C.) in step 24 (FIG. 1) and, therefore, will stay in the solid. In addition, volatile fluorides formed during the decomposition of fluosalts such as $Na_2TiF_6$ and $Na_2ZrF_6$ will condense upon cooling of the $SiF_4$ gas stream from step 24. The condensed material is then removed from the gas mainstream by in-line fume particle filtration. The presence of any metallic or dopant impurities was not detected using mass spectrometry (Table I) in either the gas produced in the above reaction or in the commercial $SiF_4$ gas. The analysis done on the $SiF_4$ by passing the gas through high purity water was based on the hypothesis that impurities should be hydrolyzed and/or trapped in the $SiO_2$ formed.

The results listed in Table II show that the level of metal impurities in the resulting $SiO_2$ is so low that, for practical purposes, the $SiF_4$ can be considered free of metallic impurities. The Na feed, reactor materials, and possible contamination of the product during handling remain as possible sources of impurities in the Si.

The impurities in Na can be divided roughly into three types according to their tendency to react with $SiF_4$, as classified by the free energy of reaction. The first type of impurity includes aluminum and elements from the groups IA, IIA and IIIB. The free energy of reaction of $SiF_4$ with these impurities ranges from $-100$ to $-200$ kcal/mole $SiF_4$ at room temperature and from $-50$ to $-100$ kcal/mole $SiF_4$ at 1500K. It is expected, therefore, that even when these impurities are present at the ppm level, they will react with the $SiF_4$ to form corresponding fluorides. Subsequently, the fluorides will be dissolved preferentially in the NaF phase.

The second type impurity includes transition metals such as Mo, W, Fe, Co, Ni, and Cu, and the elements P, As, and Sb. These elements exhibit positive free energies of reaction in excess of 100 kcal/mole $SiF_4$ and are not expected to react with $SiF_4$. However, it is an experimental fact that the silicon resulting from the $SiF_4$-Na reaction contains amounts of Fe, Ni, and Cr in proportion to the concentration of these elements in the Na feed. The mechanism by which these metals are transferred to the silicon has not yet been studied. In any case, the concentration of Fe, Cr, Ni, and also Ti can be decreased by a factor of about $10^4$ to $10^6$ for single-pass directional solidification or the Czochralski crystal-pulling procedures used presently for solar cell manufacture. At the resulting levels, these elements would not be detrimental to solar cell performance.

Boron represents a third type of impurity. The free energy of reaction of this element with $SiF_4$ is positive but small (5-20 kcal/mole $SiF_4$ for temperatures up to 1500K); therefore, some partial reaction can be expected and B will be distributed between the NaF and Si phases. It is noted that the levels of the dopant elements B, P, and As in the reaction Si are the same as in the semiconductor grade silicon used as reference or control. Since it is convenient to have dopant levels as low as possible to permit flexibility in subsequent doping procedures for semiconductor and solar cell applications, the low B and P content of Si produced in this process is of advantage. It is noted that the purity of the silicon produced by the $SiF_4$-Na reaction is, at a minimum, nominally appropriate for solar cell manufacture.

From the foregoing discussion, it will be understood that the objects of the invention have been carried in that high purity Si can be prepared and cast using the inexpensive starting materials $H_2SiF_6$ and Na. Favorable thermodynamics of the reduction step, easily controlled kinetics, and abundant availability of inexpensive starting materials make this method attractive. Of special interest for semiconductor applications are the low concentrations of B and P impurities in the product Si. The Si produced by the $SiF_4$-Na reaction, particularly when purified further by directional solidification (the casting), should be a low cost material suitable for the manufacture of solar cells and other semiconductor products.

While particular embodiments of the invention have been shown, it will, of course be understood that the invention is not limited thereto since many modifications in both process and apparatus employed may be made. It is contemplated that the appended claims will cover any such modifications as fall within the true spirit and scope of the invention.

What is claimed is:

1. A system for producing low cost, high purity, solar grade silicon by reaction of gaseous silicon tetrafluoride with sodium in substantially stoichiometric quantities to produce a reaction product from which silicon is recovered and wherein said fluoride gas used in the reaction is obtained by thermal decomposition of sodium fluosilicate which is precipitated from aqueous fluosilicic acid generated from phosphate rock conversion to fertilizer, said system including: a chemical reactant feed section and a reactor section; said reactor section including first and second reactant receiving compartments having a common wall with passages therethrough of a size to allow easy vapor transport; said chemical feed section having first reactant delivery means to introduce a first reactant into said first reactant receiving compartment and a second reactant delivery means to deliver a second reactant into said second reactant receiving compartment; and means to decompose reactant delivered to said second reactant receiving compartment thereby to generate a vapor phase reactant and cause vapor transport between said second and first reactant receiving compartments whereby reaction between said vapor phase reactant and reactant delivered to said first reactant receiving compartment reacts to produce reaction products including silicon, said reaction products being directed into a reaction product receiving and melt separation compartment having heating means surrounding said reaction product receiving and melt separation compartment so as to maintain said reaction products in the melt and facilitate separation of said reaction products.

2. A system for producing low cost, high purity, solar grade silicon as defined in claim 1 wherein said reaction product receiving and melt separation compartment operates to receive said reaction products produced and operates to separate said silicon from other reaction products in the melt, said reaction product receiving and melt separation compartment having walls formed with passages therethrough, said passages being of a size such that essentially all molten reaction products other than silicon freely pass through and molten silicon is preferentially retained.

3. A system for producing low cost, high purity, solar grade silicon as defined in claim 2 wherein a casting crucible formed of graphite is provided and said molten silicon is continuously removed from said reaction product receiving and melt separation compartment, isolated with a molten coating of reaction products other than silicon and directly casted into said casting crucible thereby to cast said silicon directly from the melt, said molten coating serves to provide a barrier which prevents said molten silicon from reacting with said casting crucible, said coating further to serve to absorb stress between the walls of said casting crucible and the solidifying said molten silicon.

4. A system for producing low cost, high purity, solar grade silicon by reaction of gaseous silicon tetrafluoride with sodium in substantially stoichiometric quantities to produce a reaction product from which silicon is recovered and wherein said fluoride gas used in the reaction is obtained by thermal decomposition of sodium fluosilicate which is precipitated from aqueous fluosilicic acid generated from phosphate rock conversion to fertilizer, said system including: a chemical reactant feed section and a reactor section; said reactor section including first and second reactant receiving compartments and third and fourth reaction product receiving compartments; said first and second reactant receiving compartments having a common wall with passages therethrough of a size to allow easy vapor transport therethrough; said chemical feed section having first reactant delivery means to introduce a first reactant into said first reactant receiving compartment and a second reactant delivery means to deliver a second reactant into said second reactant receiving compartment; means to decompose reactant delivered to said second reactant receiving compartment thereby to generate a vapor phase reactant and cause vapor transport between said second and first reactant receiving compartments whereby reaction between said vapor phase reactant and reactant delivered to said first reactant receiving compartment takes place to produce reaction products; said third reaction product receiving compartment disposed to receive reaction products from said first and said second reactant receiving compartments and having walls formed with passages therethrough, said passages being of a size such that essentially all molten reaction products other than silicon freely pass through and molten silicon is preferentially retained; said third compartment having heating means surrounding said reaction product receiving and melt separation compartment so as to maintain said reaction products in the melt and facilitate separation of said reaction products; said fourth reaction product receiving compartment substantially surrounding said third reactant receiving compartment and separated therefrom by said wall of said third reactant receiving chamber having passages therethrough thereby to collect said reaction product passing through said passages; said fourth reactant receiving compartment having an outlet thereby to constitute a reaction product collection and dispensing means; and said third reaction product compartment having an outlet for removing the reaction product remaining therein by free flow.

5. A system for producing low cost, high purity, solar grade silicon as defined in claim 4 wherein a casting crucible is provided and positioned to receive said reaction product from said outlet from said third product receiving compartment of said reactor section whereby the silicon flowing from said reactor section is cast directly from the melt.

6. A system for producing low cost, high purity, solar grade silicon as defined in claim 5 wherein said casting crucible is a high purity graphite crucible lined with liquid salt and having a shape defining a parallelepiped.

7. A system for producing low cost, high purity, solar grade silicon as defined in claim 6 wherein said parallelepiped defines a right rectangular prism.

8. A system for producing low cost, high purity, solar grade silicon as defined in claim 7 wherein means is provided to insert a silicon seed centrally through said bottom wall to contact liquid silicon in said crucible and means to cool the liquid solid interface.

9. A system for producing low cost, high purity, solar grade silicon as defined in claim 8 wherein means is provided internally and adjacent said graphite walls to absorb stress between solidifying silicon and said graphite walls thereby to absorb stress and prevent fracture of said walls during solidification of said silicon.

10. A system for producing low cost, high purity, solar grade silicon as defined in claim 5 wherein said bottom wall of said crucible is provided with a centrally located cooling parallelepiped similar to said parallelepiped defined by said lateral faces of said crucible, said cooling parallelepiped extending upwardly into said crucible from said bottom wall and sealed therein, said cooling parallelepiped having lateral faces substantially parallel to corresponding lateral faces of said crucible, and being hollow to provide for cooling from the center for silicon in said crucible. during solidification of said silicon.

11. A system for producing low cost, high purity, solar grade silicon as defined in claim 10 wherein said cooling means includes a cooling probe consisting of a pair of tubular members open to the inside of said hollow cooling parallelepiped, one of said pair of tubular members constituting a coolant delivery tube for delivery of a liquid coolant and the other tubular member of said pair constituting a coolant removal tube for removal of said coolant after delivery by said one tubular member.

12. A system for producing low cost, high purity, solar grade silicon as defined in claim 10 wherein said side walls of said crucible are disposed to constitute lateral faces of six parallelepipeds of hexagonal configuration with each parallelepiped so formed having a common side wall with each of two adjacent hexagonal parallelepiped and said cooling parallelepiped extending up between said six parallelepipeds to form a similar hexagonal prism whereby said crucible is structured substantially simultaneously to cast six single crystal or quasi single crystal ingots each in the shape of a hexagonal prism.

13. A system for producing low cost, high purity, solar grade silicon as defined in claim 11 wherein said cooling means includes a cooling probe consisting of a pair of tubular members open to the inside of said hollow cooling parallelepiped, one of said pair of tubular members constituting a coolant delivery tube for delivery of a liquid coolant and the other tubular member of said pair constituting a coolant removal tube for removal of said coolant after delivery by said one tubular member.

* * * * *